United States Patent [19]
Ishitani et al.

[11] Patent Number: 6,141,885
[45] Date of Patent: Nov. 7, 2000

[54] PRINTED CIRCUIT BOARD POSITIONING DEVICE

[75] Inventors: Yasuyuki Ishitani, Kofu; Susumu Takaichi; Makito Seno, both of Nakakoma-gun; Kiyoshi Tomita, Kofu, all of Japan

[73] Assignee: Matsushita Electric Industrial Co., Ltd., Osaka, Japan

[21] Appl. No.: 08/952,159

[22] PCT Filed: Mar. 12, 1997

[86] PCT No.: PCT/JP97/00785

§ 371 Date: Mar. 18, 1998

§ 102(e) Date: Mar. 18, 1998

[87] PCT Pub. No.: WO97/34463

PCT Pub. Date: Sep. 18, 1997

[30] Foreign Application Priority Data

Mar. 14, 1996 [JP] Japan .................................. 8-057377

[51] Int. Cl.⁷ .................................................. H01L 21/68
[52] U.S. Cl. .................... 33/645; 33/621; 33/613
[58] Field of Search .......................... 33/613, 614, 620, 33/621, 623, 644, 645, 501.09, 501.45, 542, 542.1, 544.5; 269/54.4, 289 R, 292

[56] References Cited

U.S. PATENT DOCUMENTS

| | | | |
|---|---|---|---|
| 3,639,071 | 2/1972 | Breitkopf et al. | 408/91 |
| 3,893,217 | 7/1975 | Edmond | 29/407.08 |
| 3,918,694 | 11/1975 | Laudick | 269/47 |
| 4,092,719 | 5/1978 | Salmon | 700/95 |
| 4,670,981 | 6/1987 | Kubots et al. | 29/840 |
| 4,700,488 | 10/1987 | Curti | 33/613 |
| 5,213,521 | 5/1993 | Arisaka | 439/608 |
| 5,248,869 | 9/1993 | DeBell et al. | 219/158 |
| 5,406,599 | 4/1995 | Johnson, Jr. et al. | 376/260 |
| 5,566,840 | 10/1996 | Waldner et al. | 211/41.17 |
| 5,575,076 | 11/1996 | Creeden | 33/620 |

FOREIGN PATENT DOCUMENTS

| | | |
|---|---|---|
| 54-128059 | 9/1979 | Japan . |
| 4-24542 | 2/1992 | Japan . |
| 4-201041 | 7/1992 | Japan . |
| 5-25800 | 4/1993 | Japan . |
| 7-251333 | 10/1995 | Japan . |

*Primary Examiner*—Diego Gutierrez
*Assistant Examiner*—R. Alexander Smith
*Attorney, Agent, or Firm*—Ratner & Prestia

[57] ABSTRACT

A positioning system for a circuit board having a reference positioning hole. The positioning system has a table on which the circuit board is placed and a positioning pin unit. The positioning pin unit has a plurality of nested positioning pins, each having a different pin diameter, and a plurality of springs each supporting at least one of the plurality of nested positioning pins. The circuit board, which is placed on the table, is positioned by inserting into the reference positioning hole that positioning pin having a diameter substantially matching the diameter of the reference positioning hole.

3 Claims, 15 Drawing Sheets

PRINTED CIRCUIT BOARD POSITIONING DEVICE

THIS APPLICATION IS A U.S. NATIONAL PHASE APPLICATION OF PCT INTERNATIONAL APPLICATION PCT/JP97/00785.

FIELD OF THE INVENTION

The present invention relates to the field of component mounters for mounting electronic components on printed circuit boards.

BACKGROUND OF THE INVENTION

Figure 29:
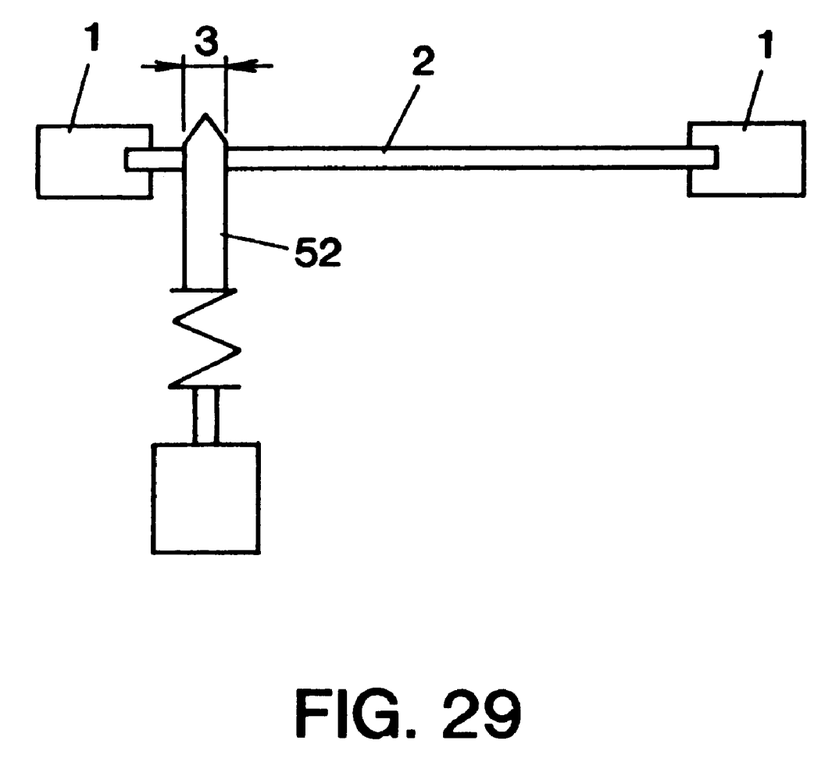
FIG. 29 is an explanatory drawing of the positioning of a printed circuit board on an XY table in the prior art.

A printed circuit board positioning device of a component mounter in the prior art is explained with reference to FIG. 29.

In the prior art, a reference positioning pin 52 with a diameter corresponding to the reference positioning hole 3 of each type of printed circuit board 2 is prepared in advance. A printed circuit board 2 is positioned on an XY table 1 by replacing the reference positioning pin 52 with one which matches the reference positioning hole 3 in the printed circuit board 2, and inserting the reference positioning pin 52 into the reference positioning hole 3.

DISCLOSURE OF THE INVENTION

Diameters of reference positioning holes vary according to manufacturer, product, and the size of the printed circuit board. A printed circuit board positioning device of the prior art may require the preparation of a reference positioning pin for mounters which match the reference hole of each type of these differing types of printed circuit boards, and may also require the replacement of the reference positioning pin when changing the type of printed circuit board, resulting in lower productivity due to the time lost during model changeover.

The present invention offers a printed circuit board positioning device which may eliminate or minimize the need for replacing the reference pin in response to the wide range of diameters of reference positioning holes found in printed circuit boards.

The present invention employs a reference positioning pin with stepped outer diameters or with built-in nested sleeves, in two-layer or three-layer form, for positioning reference positioning holes of different sized diameters using one or a minimum number of reference positioning pins.

With the above configuration, the present invention may eliminate or minimize the need for replacing the reference positioning pin every time the diameter of the reference positioning hole in the printed circuit board changes.

The present invention is a printed circuit board positioning device of an electronic component mounter which positions a printed circuit board on an XY table, for example, by inserting the reference positioning pin into the reference positioning hole on the printed circuit board. The invention employs a multi-stepped reference positioning pin so that reference positioning holes of several different sized diameters can be positioned using one reference positioning pin. This may eliminate or minimize the need for replacing the reference positioning pin every time the diameter of the reference positioning hole is changed in order to position printed circuit boards, thereby reducing production loss due to time lost during replacement of the reference positioning pin.

A further embodiment of the present invention is a printed circuit board positioning device of an electronic component mounter which positions a printed circuit board on an XY table, for example, by inserting the reference positioning pin into the reference positioning hole on the printed circuit board. The invention employs a reference positioning pin with nested and sleeved pins enclosed therein which slide by spring force. The use of this compound reference positioning pin enables the positioning of different sized reference positioning holes using one reference position pin. This may also eliminate or minimize the need for replacing the reference positioning pin every time the reference positioning hole diameter is changed thereby reducing production loss.

Another embodiment of the present invention is a printed circuit board positioning device of an electronic component mounter which positions a printed circuit board on an XY table, for example, by inserting the reference positioning pin into the reference positioning hole on the printed circuit board. The present invention selects an appropriate reference positioning pin from several reference positioning pins with different diameters. An actuator, such as a motor and cylinder moves the selected pin to a specified position for inserting the reference positioning pin into the reference positioning hole in a printed circuit board. The invention automates the replacement of the reference positioning pin to reduce the time required for replacement, thereby reducing production loss.

Another embodiment of the present invention is provided with a plurality of multi-stepped reference positioning pins in advance. An appropriate reference positioning pin is moved to a specified position by an actuator, such as motor and cylinder, for inserting the reference positioning pin into the reference positioning hole in the printed circuit board.

Another embodiment of the present invention is provided with a plurality of compound reference positioning pins in advance. An appropriate reference positioning pin is moved to a specified position by an actuator, such as a motor and cylinder, for inserting the reference positioning pin into the reference positioning hole in the printed circuit board.

The present invention may eliminate or minimize the need for replacing the reference positioning pin every time the diameter of the positioning reference hole is changed. The present invention also selects an appropriate reference pin for differing reference hole diameters quickly by providing a plurality of such reference positioning pins to the mounter and automatically placing the reference pin with the appropriate diameter.

DESCRIPTION OF THE PREFERRED EMBODIMENTS

First Exemplary Embodiment

A first exemplary embodiment of the present invention is explained with reference to drawings.

Figure 1:
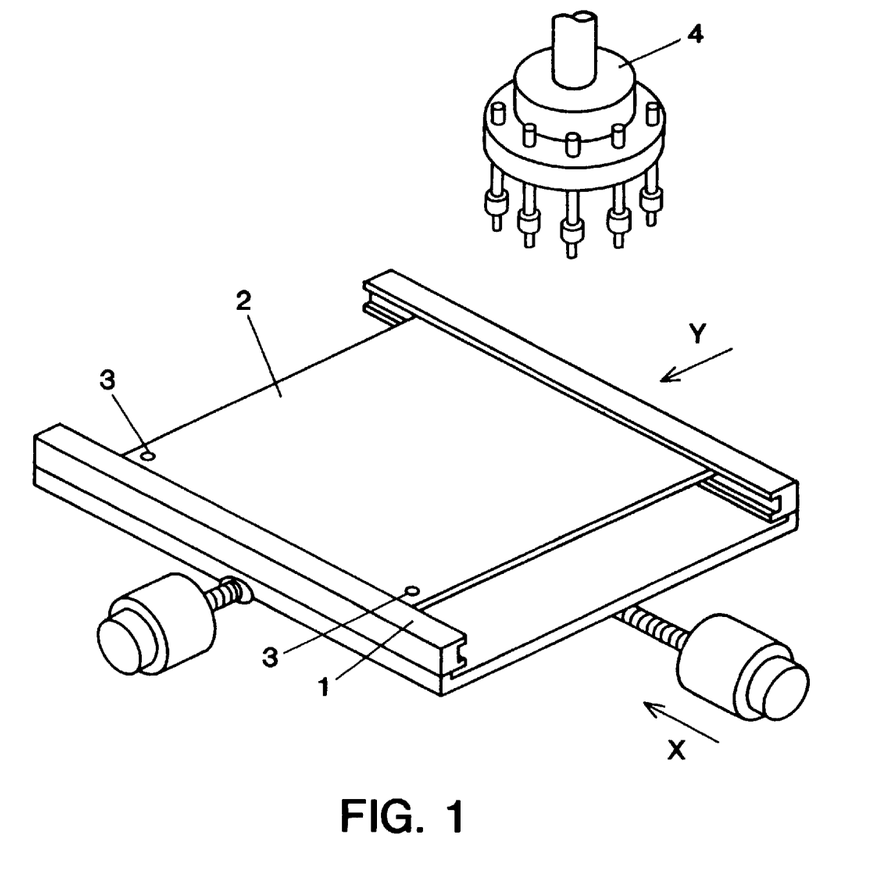
FIG. 1 is a perspective of an outline of an electronic component mounter employing an XY table.

As shown in FIG. 1, in general, an electronic component mounter mounts components on a printed circuit board 2 using a component mounting head 4 after the printed circuit board 2 is placed on an XY table 1 and positioned by inserting a reference positioning pin into a reference positioning hole 3 in the printed circuit board 2.

Figure 2:
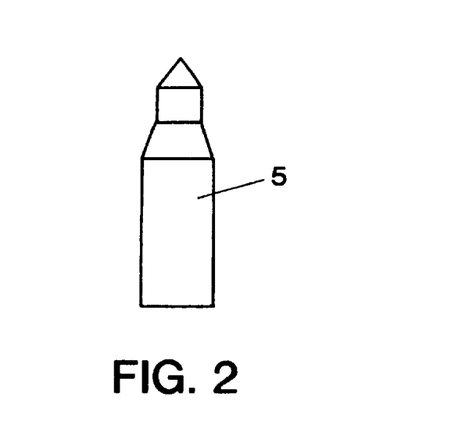
FIG. 2 is a side view of a two-stepped reference positioning pin in accordance with a first exemplary embodiment of the present invention.
Figure 3:
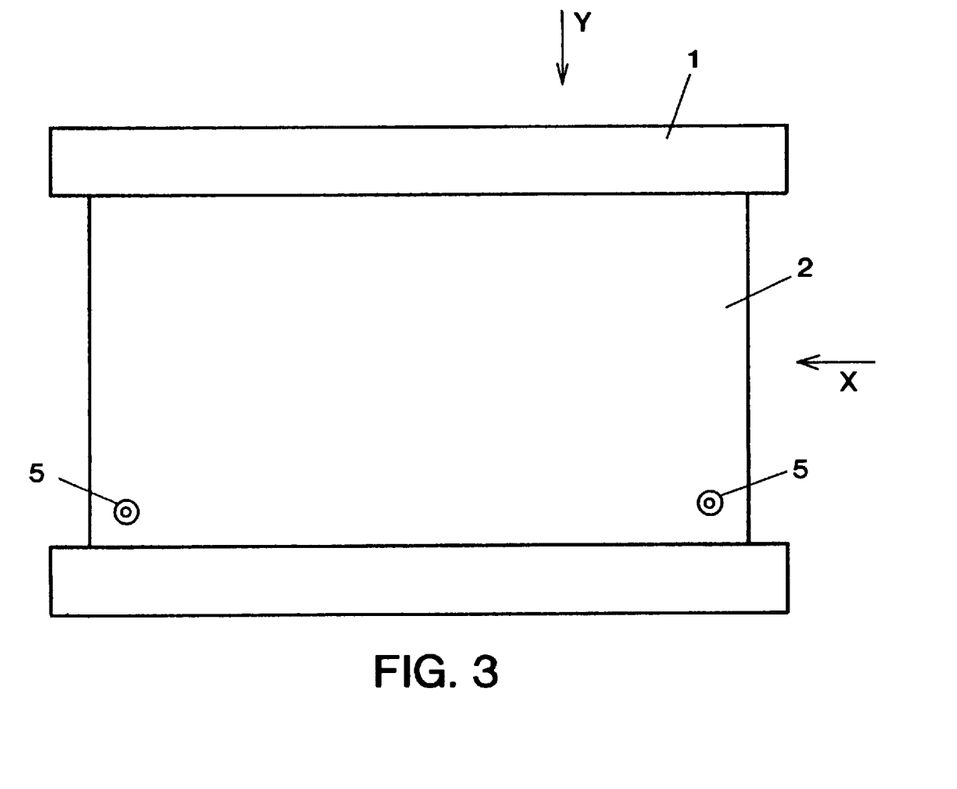
FIG. 3 is a top view of a printed circuit board positioned on an XY table in accordance with the first exemplary embodiment of the present invention.
Figure 4:
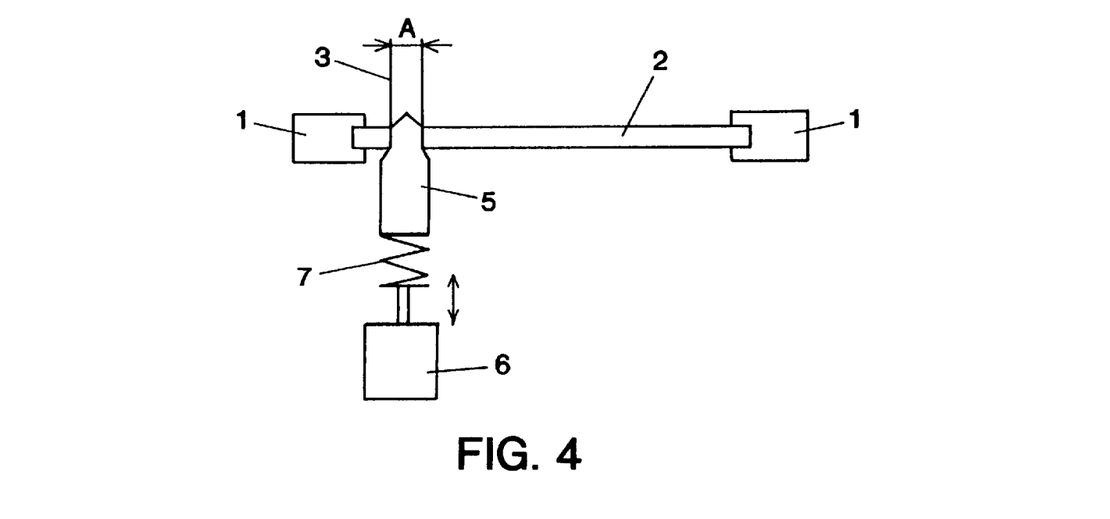
FIG. 4 is an explanatory drawing of the positioning of a printed circuit board on an XY table using a two-stepped reference positioning pin in accordance with the first exemplary embodiment of the present invention.
Figure 5:
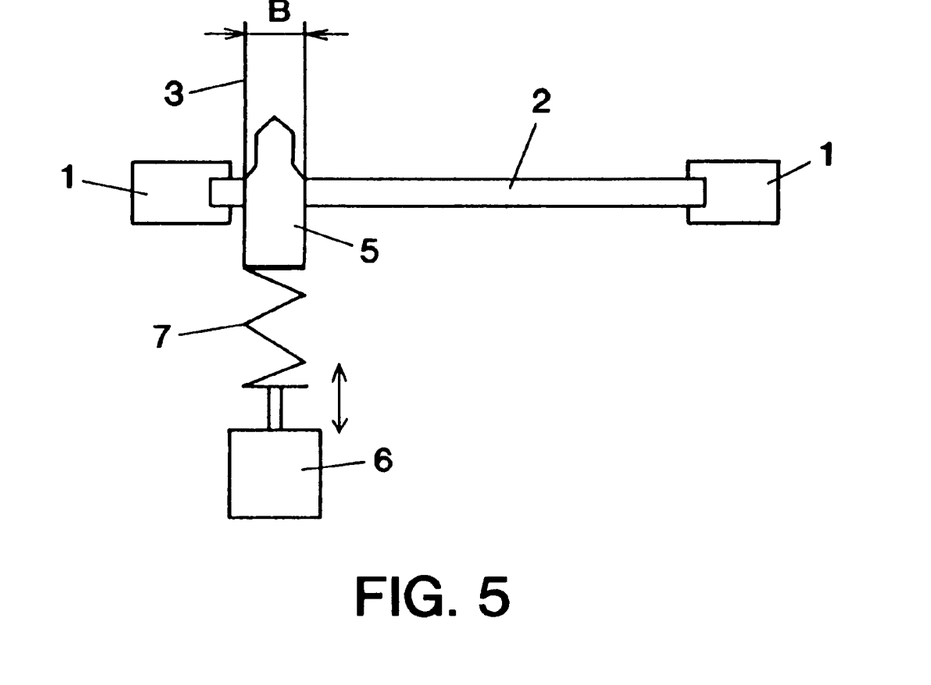
FIG. 5 is an explanatory drawing of the positioning of a printed circuit board on an XY table using a two-stepped reference positioning pin in accordance with the first exemplary embodiment of the present invention.

FIG. 2 shows a side view of a two-stepped reference positioning pin 5. FIG. 3 shows a top view of the printed circuit board 2 positioned on the XY table 1 using the two-stepped reference positioning pin 5. FIGS. 4 and 5 are side views of the positioning shown in FIG. 3, looking from the X direction.

For example, if two types of printed circuit board 2 having the reference positioning hole 3 with either hole diameter A or B are used, FIG. 4 shows the positioning of the hole diameter A, and FIG. 5 shows the positioning of the hole diameter B. Here, stepped diameters of the reference positioning pin 5 corresponding to each of the hole diameters A and B of the printed circuit board 2 are called pin diameters A and B.

In FIG. 4, the reference positioning pin 5 rises by a cylinder 6 and is inserted into the reference positioning hole 3 in the printed circuit board 2. The upper portion of the reference positioning pin with pin diameter A is inserted into the reference positioning hole 3 in the printed circuit board 2 for positioning. Since the lower portion of the reference positioning pin 5 with pin diameter B cannot be inserted into the reference positioning hole 3 in the printed circuit board 2 in this case, a spring damps the force of the cylinder 6.

In FIG. 5, the reference positioning pin 5 is inserted into the reference positioning hole in the printed circuit board 2 up to the lower portion with pin diameter B for positioning.

Figure 6:
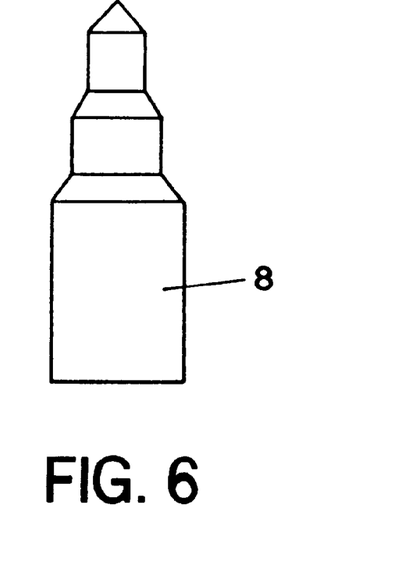
FIG. 6 is a side view of a three-stepped reference positioning pin in accordance with the first exemplary embodiment of the present invention.
Figure 7:
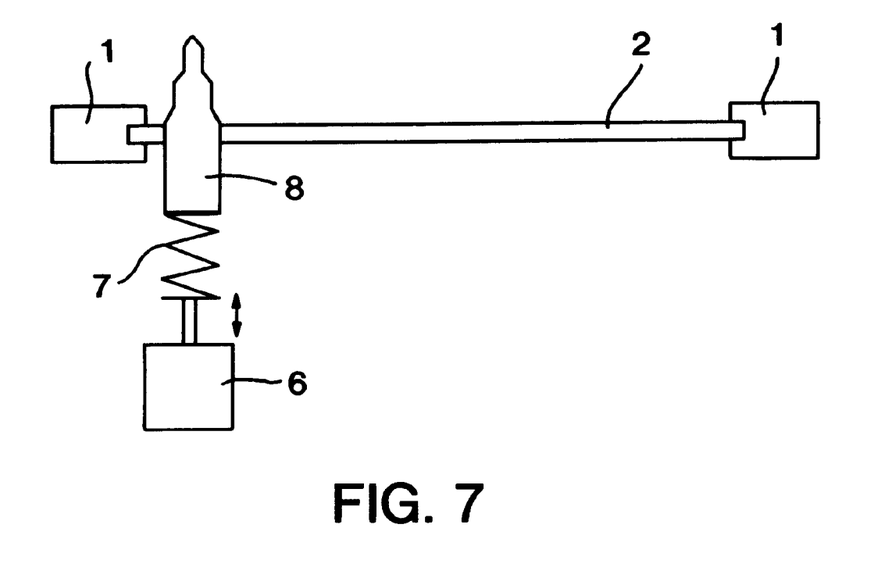
FIG. 7 is an explanatory drawing of the positioning of a printed circuit board on an XY table using a three-stepped reference positioning pin in accordance with the first exemplary embodiment of the present invention.

If there are reference positioning holes of three different diameters, a three-stepped reference positioning pin 8 as shown in FIG. 6 is employed, and the printed circuit board 2 is positioned as shown in FIG. 7. Although there are printed circuit boards 2 having different sized reference positioning holes, by providing a multi-stepped reference positioning pin for the required hole diameters, the present invention may eliminate or minimize the need for replacing the reference positioning pin every time the diameter of the positioning reference hole is changed in order to position the printed circuit board 2.

Second Exemplary Embodiment

A second exemplary embodiment is explained with reference to drawings.

Figure 8:
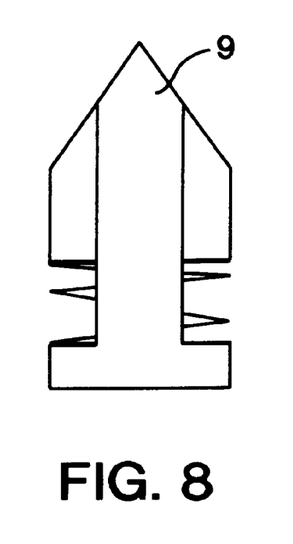
FIG. 8 is a side section view of a compound reference pin for two different hole diameters in accordance with a second exemplary embodiment of the present invention.
Figure 9:
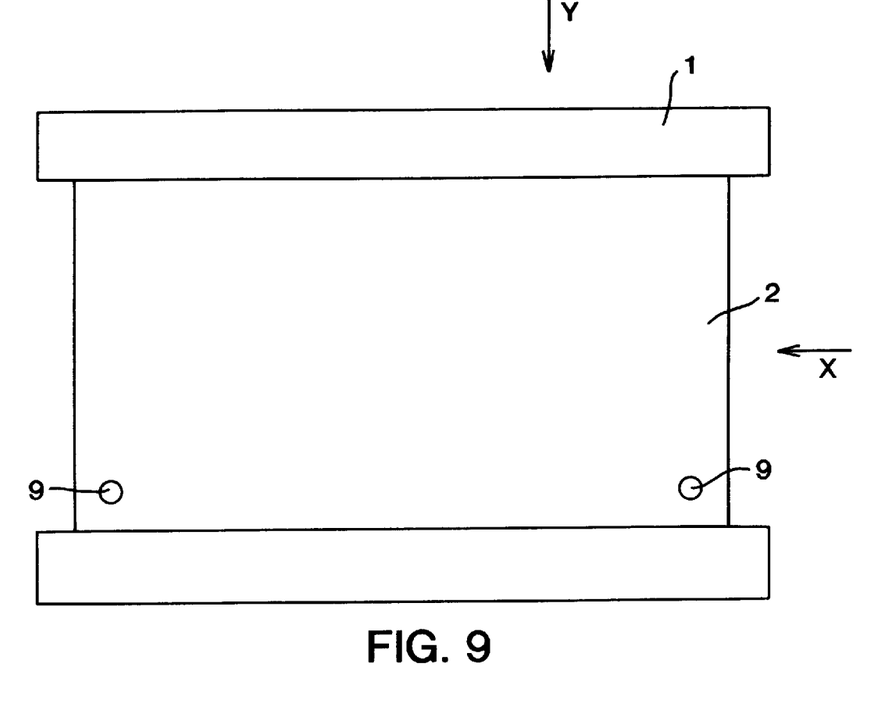
FIG. 9 is a top view of a printed circuit board positioned on an XY table in the present invention.
Figure 10:
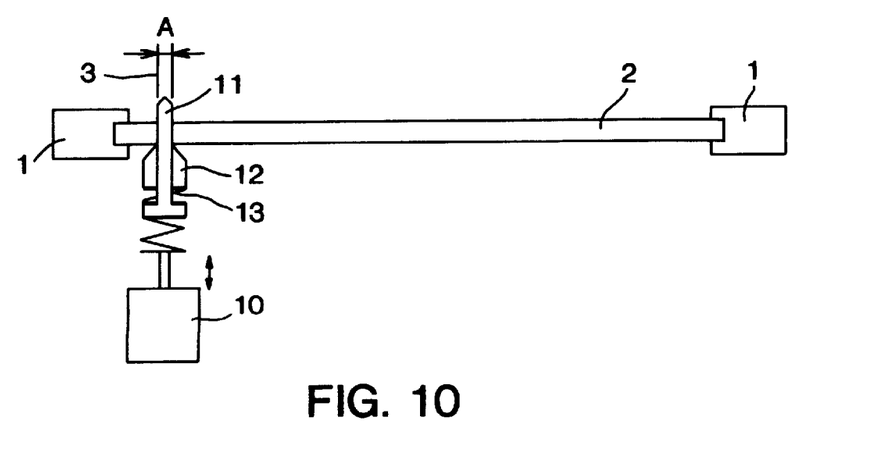
FIG. 10 is an explanatory drawing of the positioning of a printed circuit board on an XY table using a compound reference pin for two different hole diameters in accordance with the second exemplary embodiment of the present invention.
Figure 11:
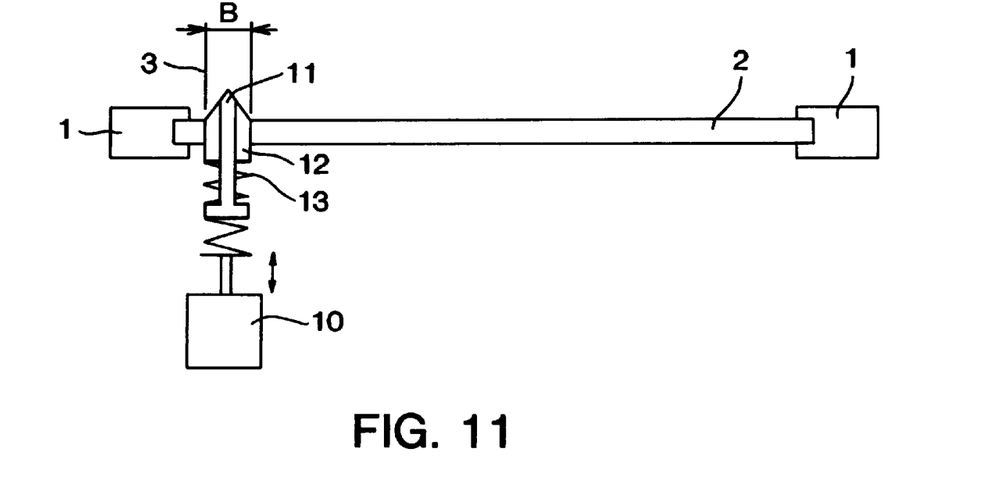
FIG. 11 is an explanatory drawing of the positioning of a printed circuit board on an XY table using a compound reference pin for two different hole diameters in accordance with the second exemplary embodiment of the present invention.
Figure 13:
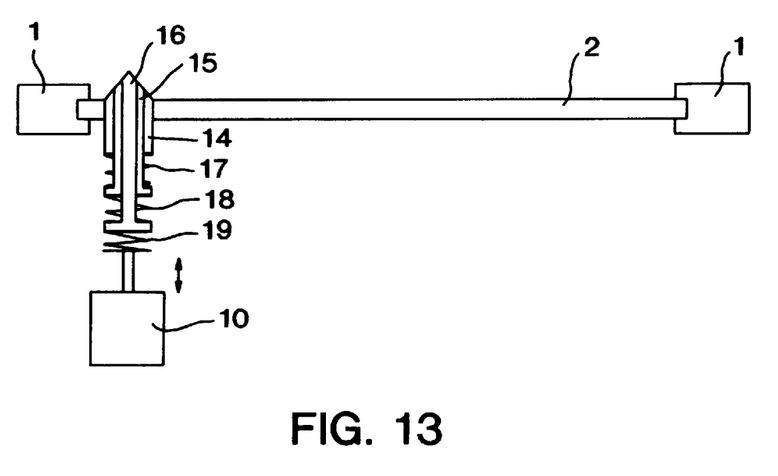
FIG. 13 is an explanatory drawing of the positioning of a printed circuit board on an XY table using a compound reference pin for three different hole diameters in accordance with the second exemplary embodiment of the present invention.

FIG. 8 shows a side section view of a compound reference positioning pin 9 for two different diameters which have an inner pin in a sleeved outer pin. FIG. 9 is a top view of the positioning of the printed circuit board 2 on the XY table 1 using the compound reference positioning pin 9. FIGS. 10, 11, and 13 are side views of the positioning shown in FIG. 9, looking from the X direction.

For example, if two types of printed circuit board 2 having the reference positioning hole 3 with either a hole diameter A or B , then FIG. 10 shows the positioning of the hole diameter A, and FIG. 11 shows the positioning of the hole diameter B. Here, pin diameters A and B of the compound reference positioning pin 9 correspond to the hole diameters A and B of the printed circuit board 2.

In FIG. 10, the compound reference positioning pin 9 rises by an actuator, such as a cylinder 10, and is inserted into the reference positioning hole 3 in the printed circuit board 2. An inner pin 11 with pin diameter A is inserted into the reference positioning hole 3 in the printed circuit board 2 for positioning. Since an outer pin 12, with the pin diameter B, cannot be inserted into the reference positioning hole 3 in the printed circuit board 2, a spring 13 damps the force of the cylinder 10.

In FIG. 11, the outer pin 12 with pin diameter B is inserted into the reference positioning hole 3 in the printed circuit board 2 for positioning.

Figure 12:
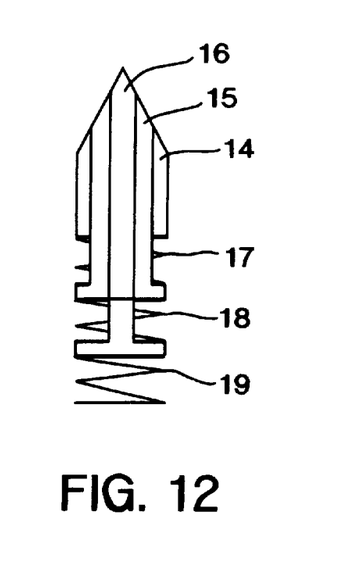
FIG. 12 is a side section view of a compound reference pin for three different hole diameters in accordance with the second exemplary embodiment of the present invention.

If there are reference positioning holes of three different diameters, two inner pins 15 and 16 for positioning are enclosed in an outer pin 14 as shown in FIG. 12. Springs 17, 18, and 19 are provided to damp the force of the cylinder 10 when a load is applied to the reference positioning pin for inserting these three reference positioning pins into the reference positioning hole 3. FIG. 13 shows the positioning using this reference positioning pin for three different diameters. Although there are printed circuit boards 2 having different sized reference positioning holes, by providing a compound reference pin with built-in reference pins for the required different diameters, the present invention may eliminate or minimize the need for replacing the reference pin every time the diameter of the reference positioning hole changes.

Third Exemplary Embodiment

A third exemplary embodiment is explained with reference to the drawings.

Figure 14:
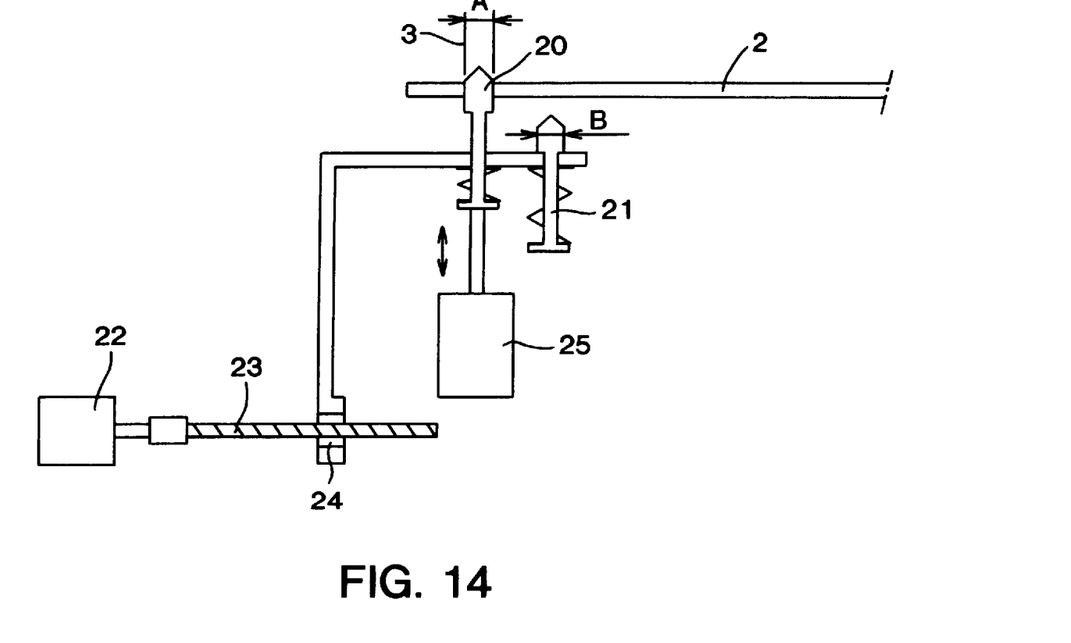
FIG. 14 is an explanatory drawing of the positioning of a printed circuit board on an XY table when there are two types of reference positioning holes in printed circuit boards in accordance with a third exemplary embodiment of the present invention.
Figure 15:
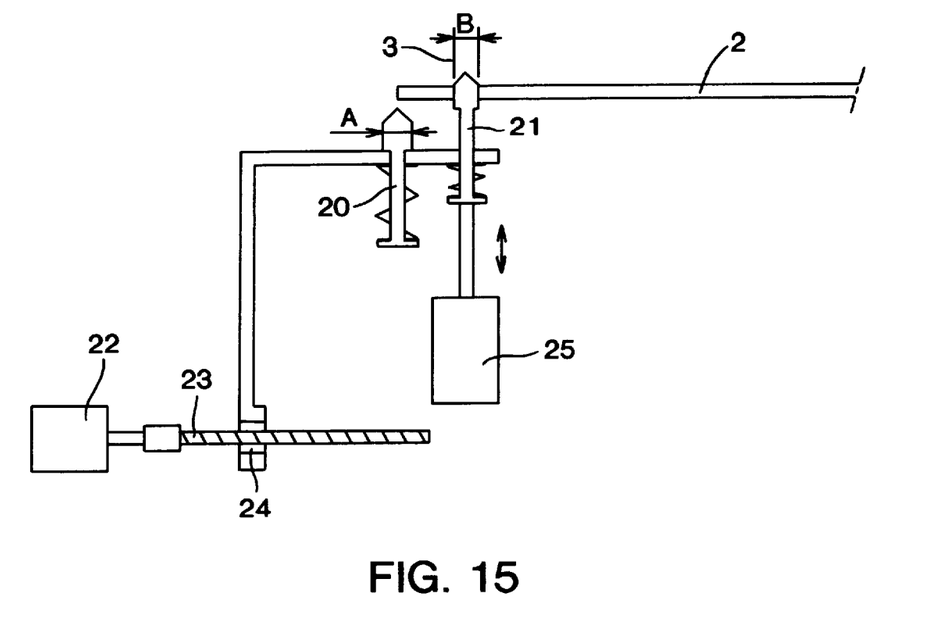
FIG. 15 is an explanatory drawing of the positioning of a printed circuit board on an XY table when there are two types of reference positioning holes in printed circuit boards in accordance with the third exemplary embodiment of the present invention.
Figure 16:
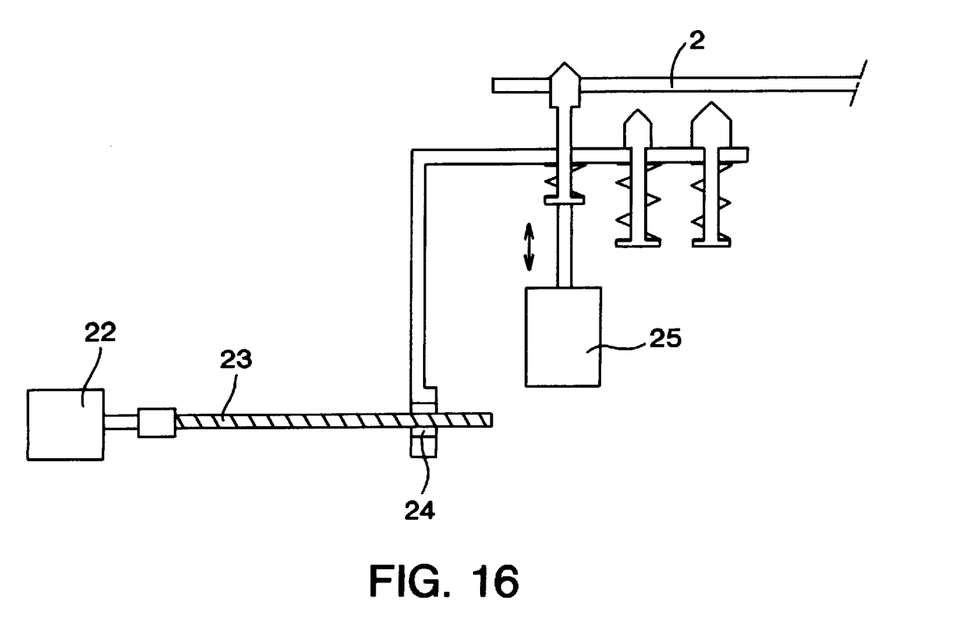
FIG. 16 is an explanatory drawing of the positioning of a printed circuit board on an XY table when there are three types of reference positioning holes in printed circuit boards in accordance with the third exemplary embodiment of the present invention.

FIGS. 14, 15, and 16 show the positioning of FIG. 1, looking from the Y direction.

For example, when using two types of printed circuit boards having the reference positioning hole 3 of either diameter A or B, FIG. 14 shows the positioning when the hole is diameter A, and FIG. 15 shows the positioning when the hole is diameter B. Here, pin diameters A and B of the reference positioning pin 5 correspond to each of the hole diameters A and B of the printed circuit board 2.

As shown in FIGS. 14 and 15, one of reference positioning pins 20 and 21, required for positioning each type of the printed circuit boards 2, is selected through a nut 24 by rotating a ball screw 23 with a motor 22. If the reference positioning pin 20 with pin diameter A is selected, a cylinder 25 raises the reference positioning pin 20, as shown in FIG. 14, and inserts it into the reference positioning hole 3. When the reference positioning pin 21 with pin diameter B is selected, the same operation as the above is conducted for positioning as shown in FIG. 15.

FIG. 16 shows the configuration and positioning in the case when there are three types of hole diameters.

Although there are printed circuit boards 2 having different sized reference positioning holes, by providing a plurality of reference positioning pins with different diameters for the required hole diameters, the present invention may eliminate the need for replacing the reference positioning pin every time the diameter of the positioning reference hole is changed in order to position the printed circuit board 2.

Fourth Exemplary Embodiment

A fourth exemplary embodiment is explained with reference to drawings.

Figure 17:
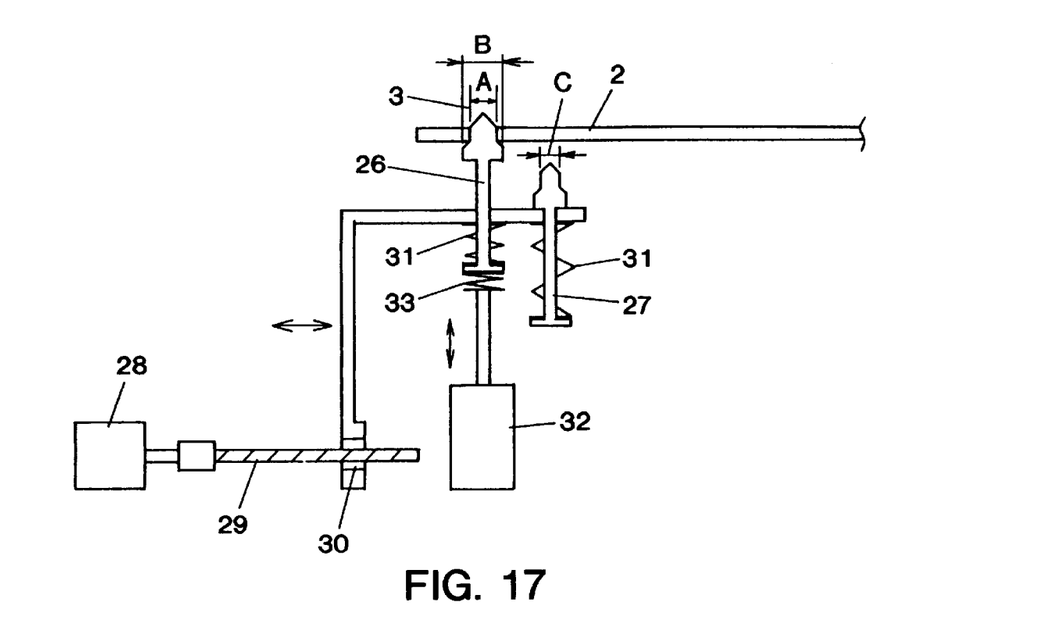
FIG. 17 is an explanatory drawing of the positioning of a printed circuit board on an XY table using two-stepped reference positioning pins in accordance with a fourth exemplary embodiment of the present invention.
Figure 18:
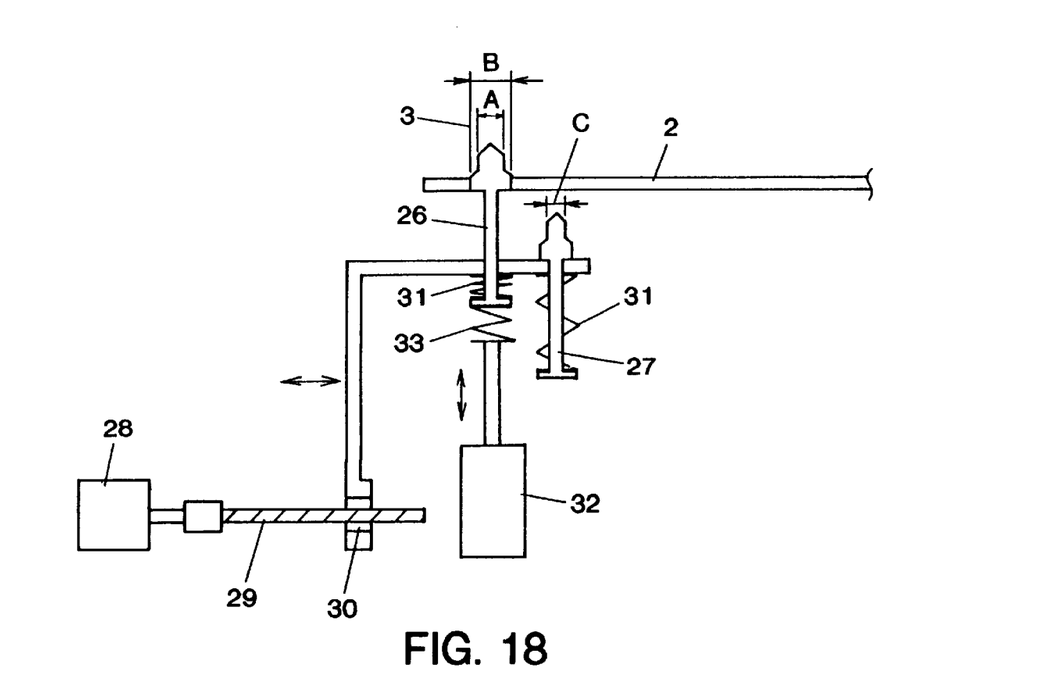
FIG. 18 is an explanatory drawing of the positioning of a printed circuit board on an XY table using two-stepped reference positioning pins in accordance with the fourth exemplary embodiment of the present invention.
Figure 19:
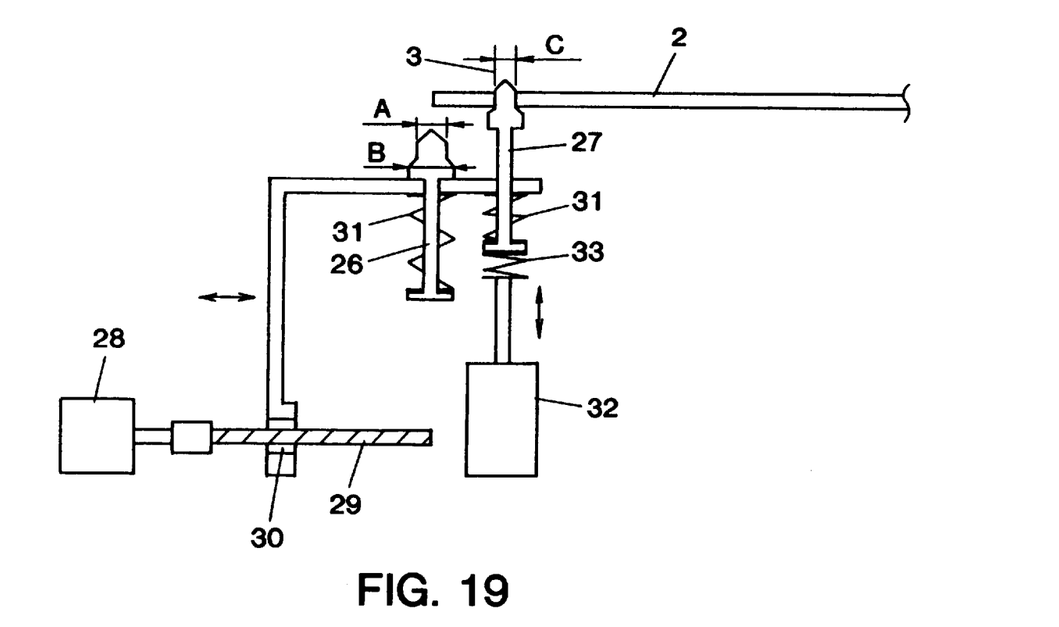
FIG. 19 is an explanatory drawing of the positioning of a printed circuit board on an XY table using two-stepped reference positioning pins in accordance with the fourth exemplary embodiment of the present invention.
Figure 20:
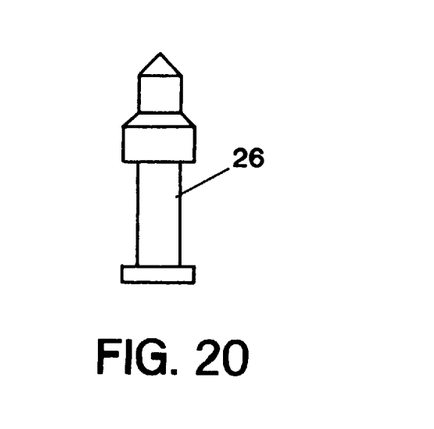
FIG. 20 is a side view of a two-stepped reference positioning pin in accordance with the fourth exemplary embodiment of the present invention.

FIGS. 17, 18, and 19 show the positioning of FIG. 1, looking from the Y drawings.

For example, FIGS. 17, 18, and 19 respectively show the positioning of three types of printed circuit boards 2, having a reference positioning hole 3 diameter of either A, B, or C. Here, stepped pin diameters A, B and C of two-stepped reference positioning pins 26 and 27 correspond to each of the hole diameters A, B, and C of the printed circuit board 2.

As shown in FIGS. 17, 18, and 19, one of the two-stepped reference positioning pin 26 and 27 suitable for positioning each type of the printed circuit boards 2 is selected through a nut 30 by rotating a ball screw 29 with a motor 28.

The two-stepped reference positioning pins 26 and 27 are always held downward by a spring 31, and they stay at the lower position when not in operation.

One of the two-stepped reference positioning pins 26 and 27 is selected and raised by a cylinder 32, and is inserted into the reference positioning hole 3 in the printed circuit board 2.

FIG. 17 shows the case when a two-stepped reference positioning pin 26 is raised by the cylinder 32 and inserted into the reference positioning hole 3 having a of the diameter A, in the printed circuit board 2. Since the lower portion with pin diameter B cannot be inserted into the reference positioning hole 3 in the printed circuit board 2 a spring 33 damps the force of the cylinder 32.

FIG. 18 shows the case when the reference positioning pin 26 is inserted into the reference positioning hole 3 in the printed circuit board 2 up to the lower portion with pin diameter B using the same mechanism.

FIG. 19 shows the case when the reference positioning pin 27 with pin diameter C is selected in the above operation, and is inserted into the reference positioning hole 3 in the printed circuit board 2.

Figure 21:
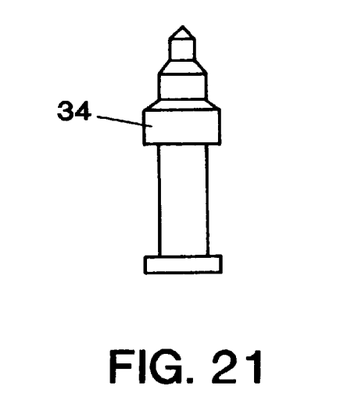
FIG. 21 is a side view of a three-stepped reference positioning pin in accordance with the fourth exemplary embodiment of the present invention.
Figure 22:
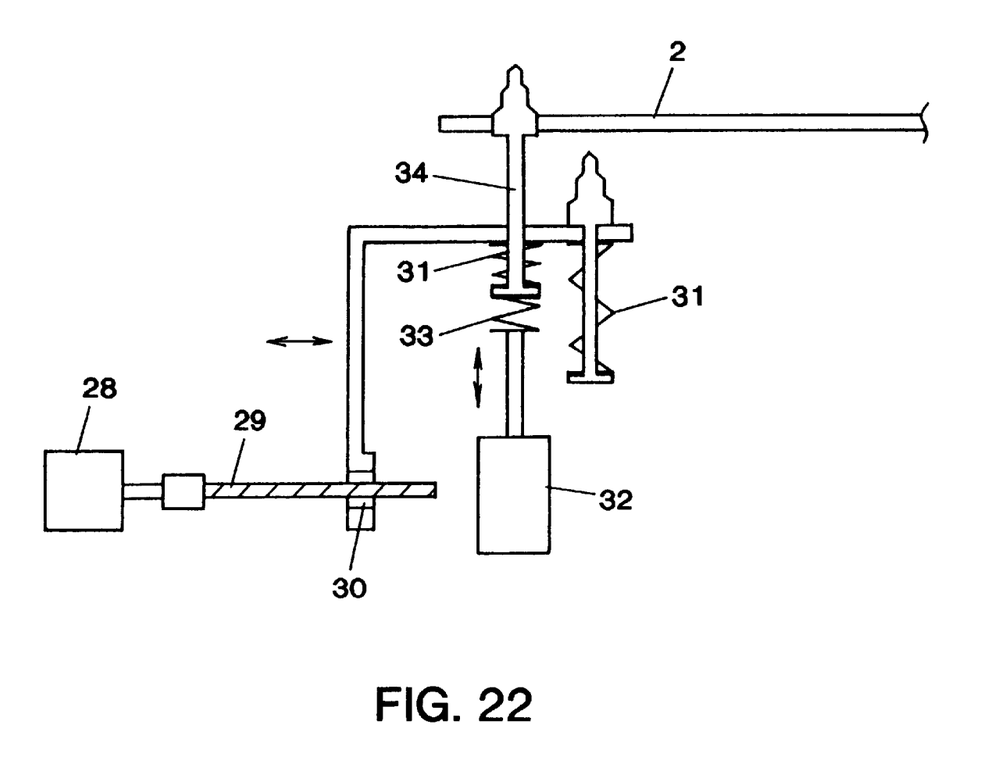
FIG. 22 is an explanatory drawing of the positioning of a printed circuit board on an XY table using three-stepped reference positioning pins in the fourth exemplary embodiment of the present invention.

If a three-stepped reference positioning pin 34 as shown in FIG. 21 is employed, the present invention enables to position printed circuit boards having reference positioning holes of six different diameters as shown in FIG. 22. Accordingly, by providing a plurality of multi-stepped pins matching required hole diameters, and selecting the pin suitable for positioning each type of printed circuit board 2 using the motor 28, the present invention may eliminate the need for replacing the reference pin every time the diameter of the reference positioning hole is changed.

Fifth Exemplary Embodiment

A fifth exemplary embodiment is explained with reference to drawings.

Figure 23:
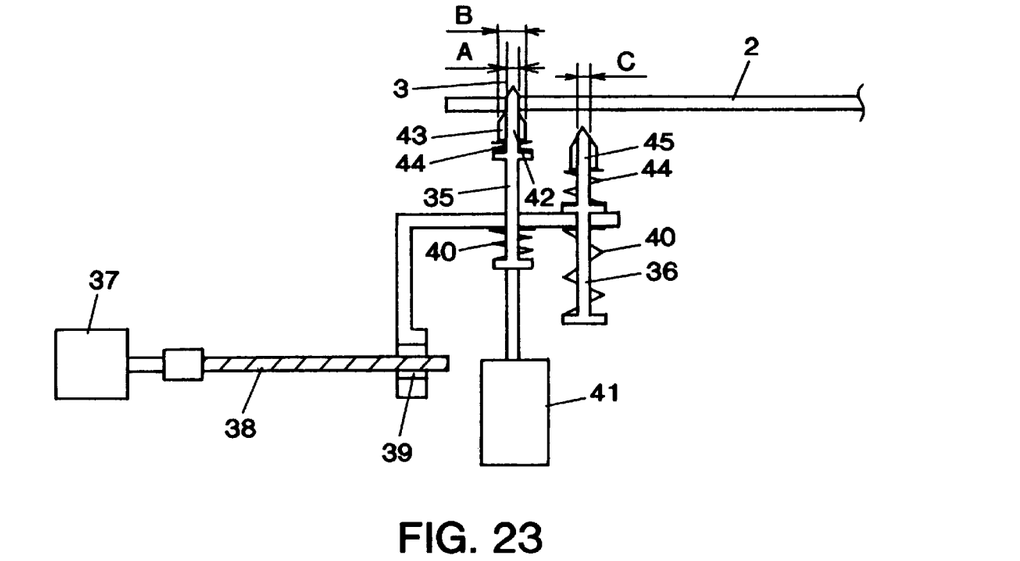
FIG. 23 is an explanatory drawing of the positioning of a printed circuit board on an XY table using compound reference pins for two different hole diameters in accordance with a fifth exemplary embodiment of the present invention.
Figure 24:
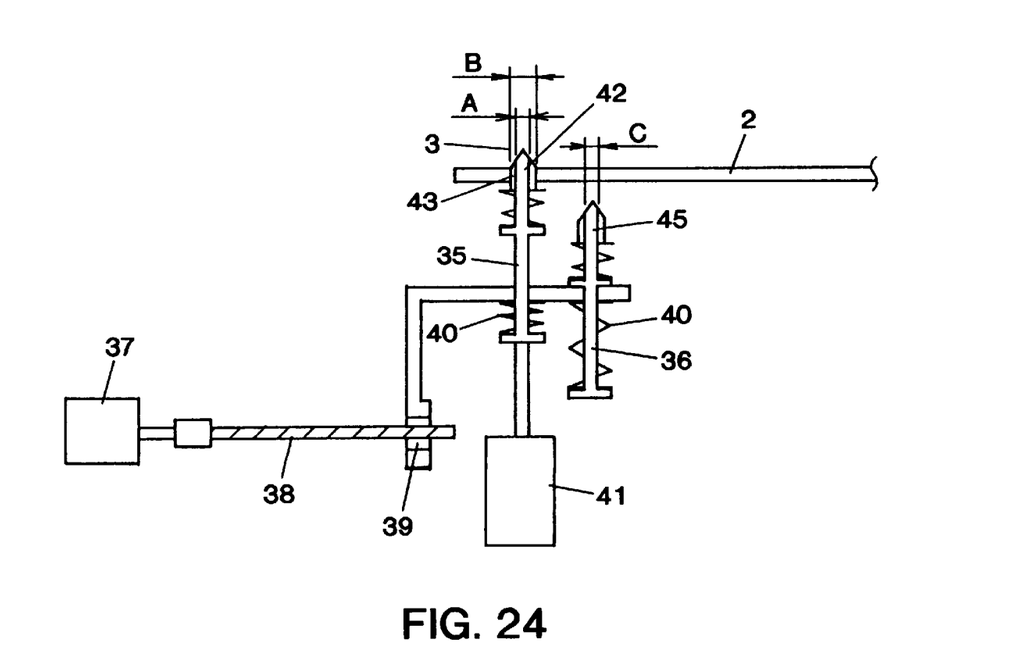
FIG. 24 is an explanatory drawing of the positioning of a printed circuit board on an XY table using a compound reference pin for two different hole diameters in accordance with the fifth exemplary embodiment in the present invention.
Figure 25:
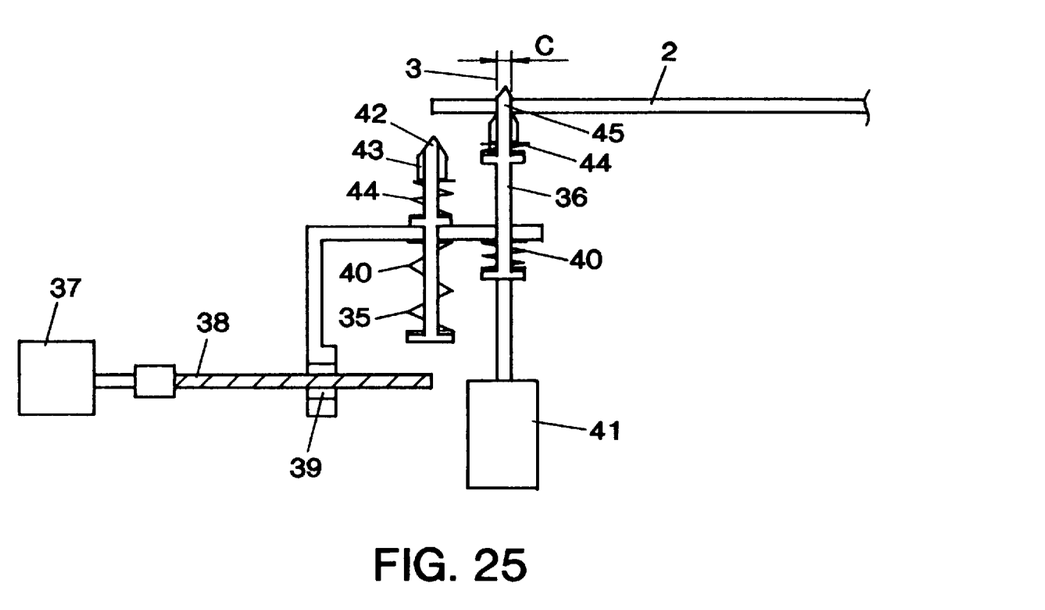
FIG. 25 is an explanatory drawing of the positioning of a printed circuit board on an XY table using a compound reference pin for two different hole diameters in accordance with the fifth exemplary embodiment in the present invention.
Figure 26:
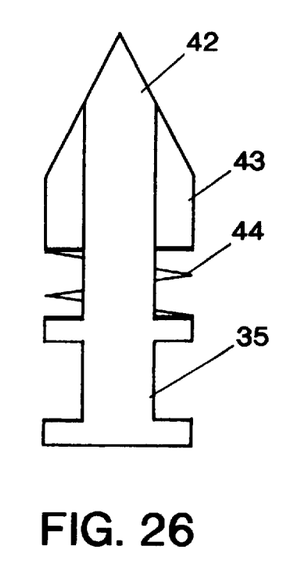
FIG. 26 is a side section view of a compound reference pin for two different hole diameters in accordance with the fifth exemplary embodiment of the present invention.

FIGS. 23, 24, and 25 are section views of the positioning shown in FIG. 1, looking from the front.

For example, FIGS. 23, 24, and 25 respectively show the positioning of three different types of printed circuit boards 2 having a reference positioning hole 3 with a diameter of either A, B, or C. Here, pin diameters A, B, and C of the reference positioning pin 5 correspond to each of the hole diameters A, B, and C of the printed circuit board 2.

As shown in FIGS. 23, 24, and 25, one of compound reference pins 35 and 36, for two different hole diameters suitable for positioning each of the printed circuit boards 2, is selected through a nut 39 by rotating a ball screw 38 with a motor 37.

The compound reference pins 35 and 36 for two different hole diameters are always held downward by a spring 40.

In FIG. 23, a cylinder 41 raises the compound reference pin 35 for two different hole diameters and inserts it into the reference positioning hole 3 in the printed circuit board 2. If an inner pin 42 with pin diameter A is inserted into the reference positioning hole 3 for positioning, a spring 44 damps the force of the cylinder 41 because an outer pin 43 with pin diameter B cannot be inserted into the reference positioning hole 3 in the printed circuit board 2.

FIG. 24 shows the configuration when inserting the outer pin 43 with pin diameter B into the reference positioning hole 3.

FIG. 25 shows the case when the compound reference pin 36, for two different hole diameters including the pin diameter C, is selected by the same operation as the above and inserted into the reference positioning hole 3 in the printed circuit board 2 for positioning.

Figure 27:
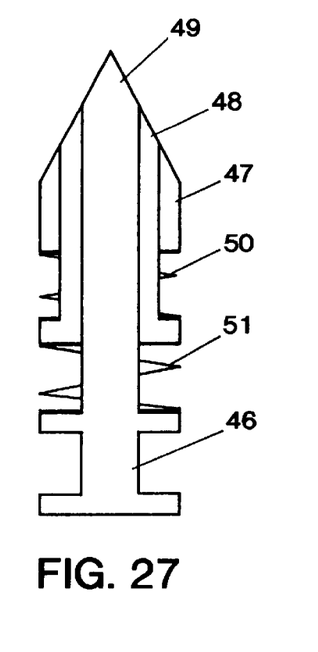
FIG. 27 is a side section view of a compound reference pin for three different hole diameters in accordance with the fifth exemplary embodiment of the present invention.
Figure 28:
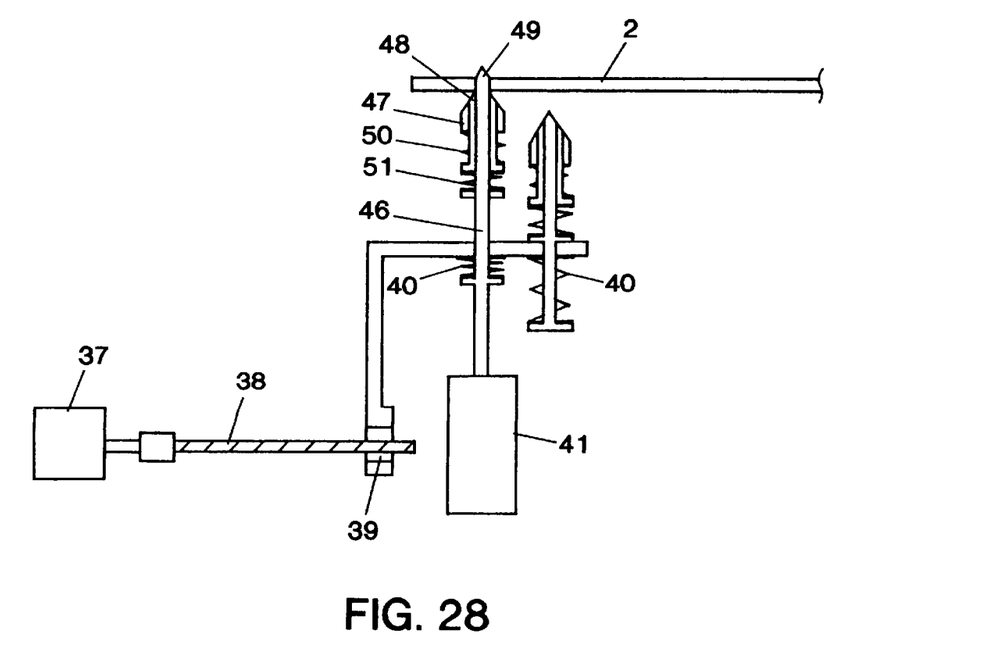
FIG. 28 is an explanatory drawing of the positioning of a printed circuit board on an XY table using a compound reference pin for three different hole diameters in accordance with the fifth exemplary embodiment in the present invention.

A compound reference pin 46, for three different hole diameters as shown in FIG. 27, has two reference positioning pins enclosed in an outer pin 47. These enclosed pins are inner pins 48 and 49. When the inner pin 48 matches the reference positioning hole 3 in the printed circuit board 2, a spring 50 damps the force of the cylinder 41 because the outer pin 47 cannot be inserted into the reference positioning hole 3. When the inner pin 49 matches the reference positioning hole 3 in the printed circuit board 2, a spring 51 also damps the force of the cylinder 41 because the inner pin 48 similarly cannot be inserted into the reference positioning hole 3. FIG. 28 shows the case when this type of reference positioning pin for three different hole diameters is employed. In this case, the present invention enables to position printed circuit boards 2 having reference positioning holes of six different diameters.

Accordingly, the present invention, may eliminate the need for replacing the reference pin every time the diameter of the reference positioning hole is changed, although there are printed circuit boards having different sized reference positioning holes, by providing a plurality of compound reference pins with enclosed pins of different diameters matching required hole diameters, and selecting the pin suitable for positioning each type of printed circuit boards 2 using a motor and an actuator.

What is claimed is:

1. A positioning system for a circuit board having a reference positioning hole, said positioning system comprising:

a table on which the circuit board is placed; and a positioning pin unit comprised of:
 a) a plurality of nested positioning pins, each having a different pin diameter, and
 b) a plurality of springs, each supporting at least one of said plurality of nested positioning pins, wherein the circuit board which is placed on said table is positioned by inserting into the reference positioning hole that positioning pin of said plurality of nested positioning pins having a diameter substantially matching the diameter of the reference positioning hole.

2. A positioning system for a circuit board having a reference positioning hole comprising:

a table which supports the circuit board, a positioning pin unit having:
 (a) a plurality of nested positioning pins, and
 (b) a plurality of springs, each supporting at least one of said plurality of nested positioning pins; and means for locating said positioning pin unit to engage the reference positioning hole of the circuit board, wherein that nested positioning pin of said plurality of nested positioning pins having a diameter which substantially matches the diameter of said reference positioning hole of the circuit board is adapted to engage the reference positioning hole of the circuit board.

3. A positioning system for a circuit board having a reference positioning hole comprising:

a table which supports the circuit board;

a plurality of pin units, each pin unit having a tapered leading end and a plurality of sections arranged in a nested configuration, each said section having a different diameter;

means for selecting a positioning pin unit from said plurality of pin units for engaging the reference hole;

means for moving the selected positioning pin unit to a location for insertion into the reference hole of the circuit board, wherein said moving means positions the selected pin unit to engage the reference positioning hole of the circuit board with the section of said plurality of sections having a diameter which substantially matches the diameter of the reference positioning hole.

* * * * *